(12) United States Patent
Hirai et al.

(10) Patent No.: US 10,234,775 B2
(45) Date of Patent: Mar. 19, 2019

(54) EXPOSURE APPARATUS, EXPOSURE METHOD, AND METHOD OF MANUFACTURING ARTICLE

(71) Applicant: CANON KABUSHIKI KAISHA, Tokyo (JP)

(72) Inventors: Shinichiro Hirai, Saitama (JP); Junichi Motojima, Utsunomiya (JP); Naoto Ohkawa, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/806,678

(22) Filed: Nov. 8, 2017

(65) Prior Publication Data
US 2018/0143542 A1 May 24, 2018

(30) Foreign Application Priority Data
Nov. 18, 2016 (JP) ................ 2016-225372

(51) Int. Cl.
*G03B 27/42* (2006.01)
*G03F 7/20* (2006.01)
(Continued)

(52) U.S. Cl.
CPC ........ *G03F 7/70775* (2013.01); *G03F 7/7085* (2013.01); *G03F 7/70483* (2013.01);
(Continued)

(58) Field of Classification Search
CPC ..... H01L 24/02; H01L 24/96; H01L 23/3107; H01L 2224/02311; H01L 2224/02375; H01L 2224/02379; G03F 7/70775; G03F 7/7085; G03F 7/70758; G03F 7/70733; G03F 7/70725; G03F 7/70691;
(Continued)

(56) References Cited

U.S. PATENT DOCUMENTS 5,985,495 A * 11/1999 Okumura ............. G03F 7/2002
430/22
6,236,447 B1 * 5/2001 Yamada ................ G03F 9/7034
355/53
(Continued)

FOREIGN PATENT DOCUMENTS

JP 2002100552 A 4/2002

*Primary Examiner* — Christina A Riddle
(74) *Attorney, Agent, or Firm* — Rossi, Kimms & McDowell LLP

(57) ABSTRACT

The present invention provides an exposure apparatus which exposes a substrate, comprising a measurement unit configured to measure a height of the substrate at each of a plurality of measurement points, and a control unit configured to control the height of the substrate based on measurement results obtained by the measurement unit, and control an operation to arrange a shot region of the substrate in a first position and expose the shot region, wherein the shot region includes a plurality of partial regions, and the control unit causes the measurement unit to measure the height of the substrate by arranging the shot region in a second position different from the first position so that the number of measurement points arranged in the plurality of partial regions is larger than that when arranging the shot region in the first position.

12 Claims, 5 Drawing Sheets

(51) Int. Cl.
  *H01L 23/00* (2006.01)
  *G03F 9/00* (2006.01)
  *H01L 23/31* (2006.01)
(52) U.S. Cl.
  CPC ........ *G03F 7/70725* (2013.01); *G03F 9/7026* (2013.01); *G03F 9/7034* (2013.01); *H01L 24/02* (2013.01); *H01L 24/96* (2013.01); *H01L 23/3107* (2013.01)
(58) Field of Classification Search
  CPC ...... G03F 7/70483; G03F 7/22; G03F 9/7026; G03F 9/7034
  USPC ...... 355/52, 53, 55, 67–71, 72, 77; 356/123, 356/601, 609, 614, 624, 4.01, 4.08; 250/492.1, 492.2, 492.22, 548
  See application file for complete search history.

(56) References Cited

U.S. PATENT DOCUMENTS

| | | | | |
|---|---|---|---|---|
| 6,381,004 | B1* | 4/2002 | Hagiwara | G03B 27/42 355/53 |
| 2002/0166982 | A1* | 11/2002 | Kataoka | G03F 7/70458 250/548 |
| 2007/0285641 | A1* | 12/2007 | Motojima | G03B 27/42 355/53 |

* cited by examiner

EXPOSURE APPARATUS, EXPOSURE METHOD, AND METHOD OF MANUFACTURING ARTICLE

BACKGROUND OF THE INVENTION

Field of the Invention

The present invention relates to an exposure apparatus, an exposure method, and a method of manufacturing an article.

Description of the Related Art

In recent years, a semiconductor device packaging method called FOWLP (Fan Out Wafer Level Packaging) is being adopted in semiconductor-device manufacturing processes. FOWLP is a method for forming a wiring layer, electrode pads and the like, by using an exposure apparatus, on a substrate constituted by arranging and fixing a plurality of semiconductor chips which have been preprocessed and diced by a molding material. Such substrate is also referred to as a reconstructed substrate.

In the exposure apparatus, in order to arrange the surface of the substrate on the imaging plane (focusing plane) of a projection optical system, the height of the substrate is measured at each of a plurality of measurement points in the light path region of the light from the projection optical system, and the alignment of the substrate in the height direction is performed based on the measurement results. However, for example, due to difficulties in achieving the flattening of the molding material on the reconstructed substrate or due to the removal of a portion of the layer formed on the substrate, a step may be formed on the target substrate that is to undergo exposure processing by the exposure apparatus. In such a substrate, if measurement points are arranged in two regions, respectively, that have different heights from each other due to the step, it becomes difficult to accurately align the substrate in the height direction based on the measurement results of the plurality of measurement points. In Japanese Patent Laid-Open No. 2002-100552, there is disclosed a method of selecting, from the substrate height measurement results of the plurality of measurement points (sensors), a measurement point which is to be used for the alignment of the substrate in the height direction.

In the exposure apparatus, it is preferable to use as many measurement results as possible from the measurement results of the plurality of measurement points so that the alignment of the substrate in the height direction can be performed accurately.

SUMMARY OF THE INVENTION

The present invention provides, for example, a technique advantageous in accurately performing alignment in the height direction of the substrate.

According to one aspect of the present invention, there is provided an exposure apparatus which exposes a substrate via a projection optical system, comprising: a measurement unit configured to measure a height of the substrate at each of a plurality of measurement points in an optical path region of light from the projection optical system; and a control unit configured to control at least one of the height and a tilt of the substrate based on measurement results obtained by the measurement unit, and control an operation to arrange a shot region of the substrate in a first position and expose the shot region, wherein the shot region includes a plurality of partial regions on which patterns are to be formed, and the control unit causes the measurement unit to measure the height of the substrate by arranging the shot region in a second position different from the first position so that the number of measurement points arranged in the plurality of partial regions is larger than that when arranging the shot region in the first position.

Further features of the present invention will become apparent from the following description of exemplary embodiments with reference to the attached drawings.

DESCRIPTION OF THE EMBODIMENTS

Figure 1:
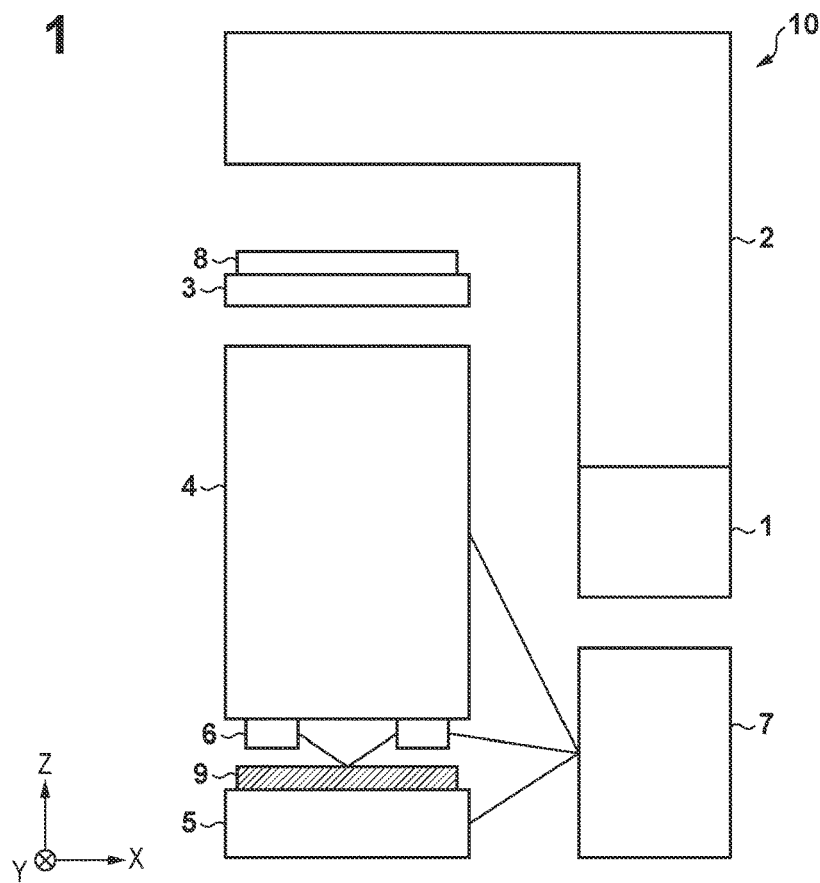
FIG. 1 is a schematic view showing an exposure apparatus according to the first embodiment.

Exemplary embodiments of the present invention will be described below with reference to the accompanying drawings. Note that the same reference numerals denote the same members throughout the drawings, and a repetitive description thereof will not be given.

First Embodiment

An exposure apparatus 10 according to the first embodiment of the present invention will be described with reference to FIG. 1. FIG. 1 is a schematic view showing the exposure apparatus 10 according to the first embodiment. The exposure apparatus 10 according to the first embodiment can include, for example, a light source 1, an illumination optical system 2, a mask stage 3, a projection optical system 4, a substrate stage 5, a measurement unit 6, and a control unit 7. The control unit 7 includes, for example, a CPU and a memory, and controls each unit of the exposure apparatus 10 (controls an operation to expose the shot region of a substrate 9). Also, in this embodiment, a direction parallel to the optical axis of light emitted from the projection optical system 4 is set as the Z direction, and two directions which are perpendicular with respect to the optical axis and are orthogonal to each other are set as the X direction and the Y direction.

The light source 1 is, for example, formed from an i-line mercury lamp or an excimer laser and emits light (exposure light) for exposing the substrate 9. The illumination optical system 2 guides the light emitted from the light source 1 to uniformly illuminate a mask 8 held by the mask stage 3. The projection optical system 4 has a predetermined projection magnification and projects, onto the substrate 9, a pattern formed on the mask 8. The substrate stage 5 is configured to be movable while holding the substrate 9, and its position and orientation are managed with high accuracy by a position measurement mechanism such as an interferometer or an encoder (not shown).

In the exposure apparatus 10 formed in this manner, an exposure processing of arranging a shot region of the substrate 9 in an exposure position (first position) and exposing the shot region with light from the projection optical system 4 is performed. That is the exposure processing is processing to cause a photosensitive material such as a resist or a polyimide to react by exposing the photosensitive material supplied (coated) on the shot region with light (the pattern image of the mask) from the projection optical system 4. Such exposure processing is sequentially performed for each of the plurality of shot regions on the substrate 9 by causing the substrate stage 5 to move step by step. Subsequently, after the development processing of the substrate 9, a pattern is formed on the substrate 9 (more specifically, on the photosensitive material supplied on the substrate). Here, a shot region indicates a region of the substrate 9 which is exposed at once at each exposure processing operation (that is, a region of the substrate 9 which is arranged in an irradiation region of light from the projection optical system 4). The irradiation region of light from the projection optical system 4 is the light path region of the light emitted from the projection optical system 4. Also, the exposure position is a position where a shot region is to be arranged when exposing the shot region with the light from the projection optical system 4. That is, the exposure position is the position of the shot region when the position of the shot region has been determined with respect to the irradiation region (the light path region of the light from the projection optical system 4).

Figure 2:
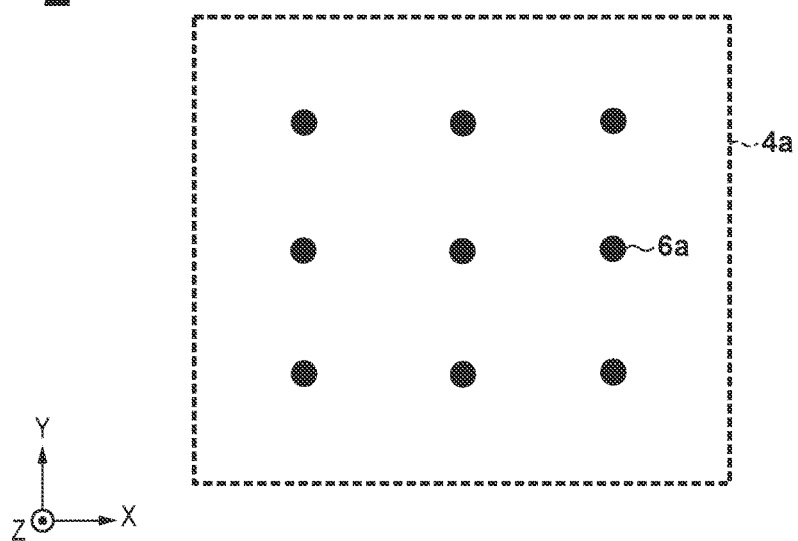
FIG. 2 is a view showing an irradiation region of light from a projection optical system and a plurality of measurement points arranged inside the region.

In addition, in the exposure apparatus 10, at least one of the height and the tilt of the substrate 9 is controlled before the exposure processing so that the surface of the substrate 9 will match with the imaging plane (focusing plane) of the projection optical system 4. Hence, the measurement unit 6 (focus sensor) which measures the height of the substrate 9 at each of a plurality of measurement points in an irradiation region of light from the projection optical system 4 is provided in the exposure apparatus 10. As shown in FIG. 2, the arrangement (layout) of a plurality of measurement points 6a is fixed in an irradiation region 4a (in a light path region) of the light from the projection optical system 4, and the measurement unit 6 is configured to measure the height of the substrate 9 at each of the plurality of measurement points 6a. The measurement unit 6 includes a plurality of oblique-incidence type optical sensors that receive light reflected by causing the light to be obliquely incident on the substrate 9, and uses this plurality of optical sensors to measure the height of the substrate at each of the plurality of measurement points 6a. As a result, the exposure apparatus 10 (the control unit 7) can control at least one of the height and the tilt of the substrate 9 based on the measurement results of the height of the substrate 9 at the plurality of measurement points 6a. FIG. 2 is a view showing the irradiation region 4a of the light from the projection optical system 4 and the plurality of measurement points 6a arranged inside the irradiation region.

Here, although the measurement unit 6 according to this embodiment is arranged to include optical sensors that cause the light to be incident on the substrate 9, the present invention is not limited to this. The measurement unit may include sensors such as capacitance sensors or pressure sensors. Also, although nine measurement points 6a are arranged in a matrix in the irradiation region 4a in the example shown in FIG. 2, the number and the positions of the measurement points 6a arranged in the irradiation region 4a are not limited to this. Note that the operation to control at least one of the height and the tilt of the substrate 9 may be simply referred to as "alignment of the substrate 9 in the height direction" hereinafter.

Figure 3:
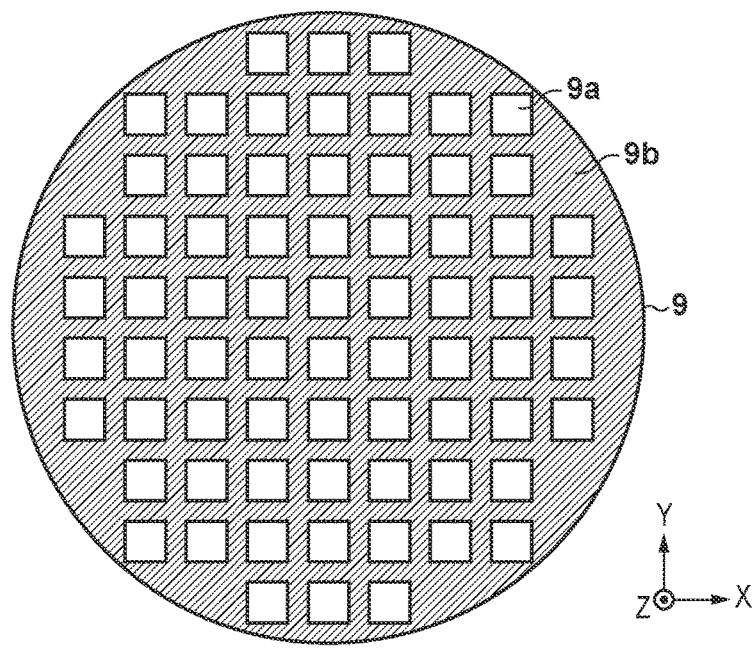
FIG. 3 is a view showing a substrate (reconstructed substrate)
Figure 4:
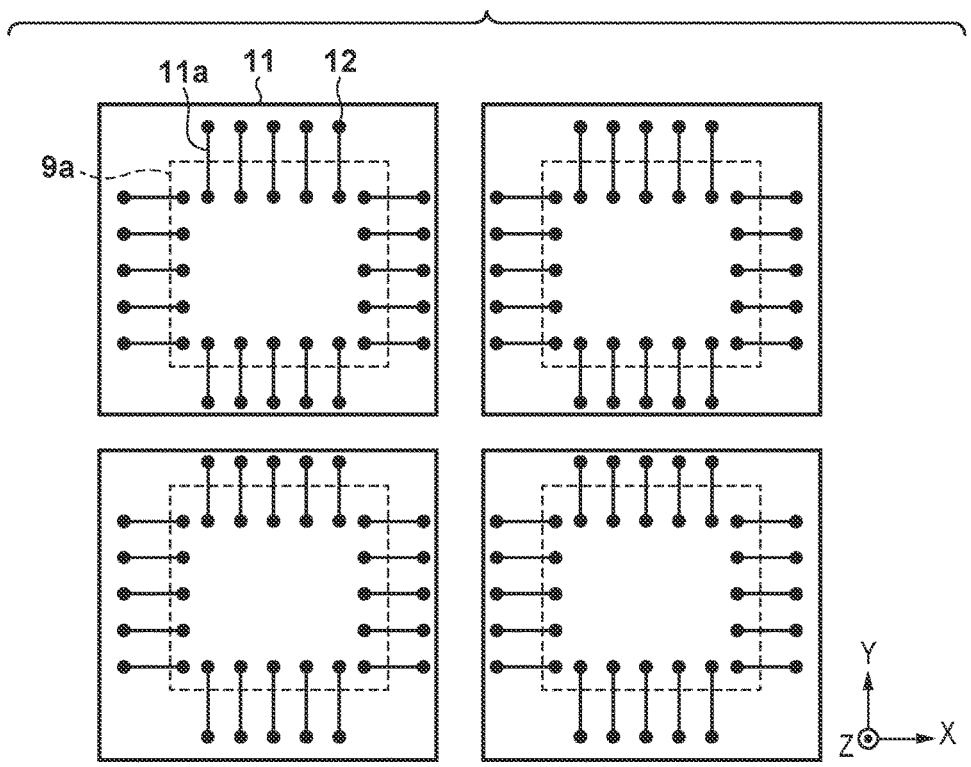
FIG. 4 is a view showing a state in which wiring layers and electrode pads have been formed on each of a plurality of semiconductor chips.

In recent years, a semiconductor device packaging method called FOWLP is being adopted in the manufacturing processes of a semiconductor device. As shown in FIG. 3, FOWLP uses the substrate 9 which is formed by arranging and fixing a plurality of semiconductor chips 9a, which have been preprocessed and diced, by a molding material 9b. This kind of substrate 9 is also referred to as a reconstructed substrate. Wiring layers 11 (wiring lines 11a) and electrode pads 12, as those shown in FIG. 4, are formed on this kind of substrate 9 (reconstructed substrate) by using a microlithography technique performed by an exposure apparatus. FIG. 4 is a view showing a state in which the wiring layer 11 and the electrode pads 12 have been formed for each of the plurality (four) semiconductor chips 9a. The wiring layer 11 and the electrode pads 12 can be formed not only on each semiconductor chip 9a but also on the molding material 9b as is obvious from FIG. 4. Also, although the wiring layer 11 is formed on each semiconductor chip 9a in the example shown in FIG. 4, a wiring layer that connects the plurality of semiconductor chips 9a to each other may be formed, for example, on the plurality of semiconductor chips 9a.

Figure 5A:
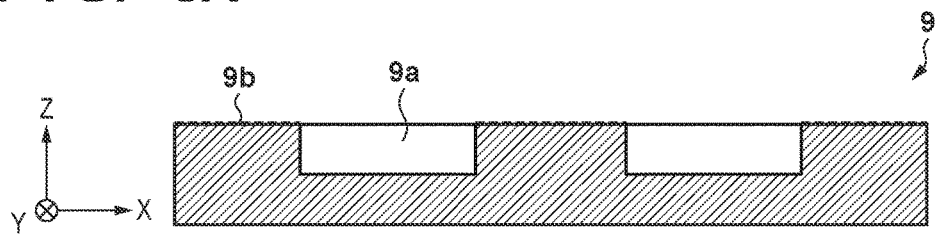
FIG. 5A is a view showing a section of the reconstructed substrate.
Figure 5B:
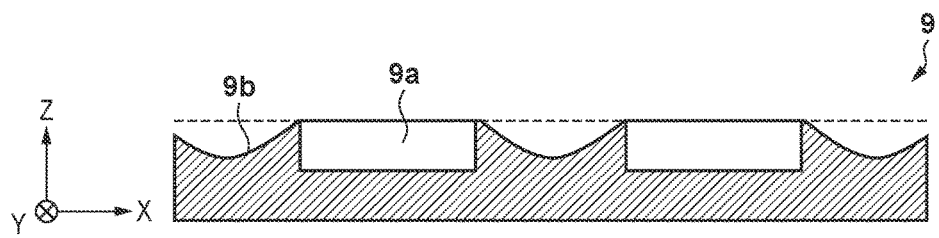
FIG. 5B is a view showing a section of the reconstructed substrate.
Figure 5C:
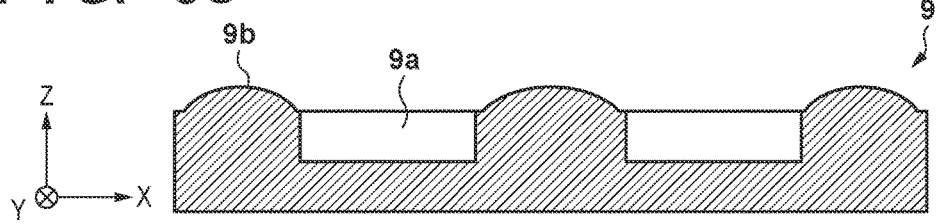
FIG. 5C is a view showing a section of the reconstructed substrate.
Figure 6:
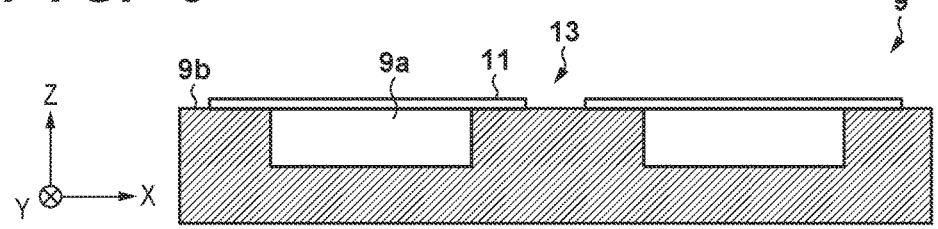
FIG. 6 is a view showing a section of the reconstructed substrate after the formation of the wiring layers.

In some cases, for example, flattening of the molding material on the reconstructed substrate may be difficult to perform, and the surface roughness may be large (see FIG. 5A), recesses may be formed (see FIG. 5B), or convex portions may be formed (see FIG. 5C) in a region where the molding material is exposed on the substrate surface. That is, on the substrate 9 which is the target of exposure processing by the exposure apparatus 10, a step region that has a different height may be formed in a region (a region including the semiconductor chip 9a) where a pattern is to be formed. Also, the step region may be formed because a portion of a layer formed on the substrate has been removed. For example, each wiring layer 11 to be formed on the reconstructed substrate is generally formed by performing a plating process using, as a conductor, a seed layer formed on the entire surface of the substrate 9. Such a seed layer can speed up the wear (degradation) of the dicing blade used when the reconstructed substrate is diced. Hence, the seed layer that is formed above a cutting region 13 which is to be cut by the dicing blade is removed after each wiring layer 11 has been formed. As a result, as shown in FIG. 6, on the substrate 9 after the formation of each wiring layer 11, the cutting region 13 becomes a step region that has a lower height than the region (region on which the wiring layer 11 has been formed) on which the electrode pads 12 are to be formed.

In the substrate 9 on which a step region has been formed in this manner, when the measurement unit 6 is to measure the height of the substrate 9 at each of the plurality of measurement points 6a, some of the measurement points 6a of the plurality of measurement points 6a may be arranged in the step region (for example, the cutting region 13). In this case, it becomes difficult to accurately perform the alignment of the substrate 9 in the height direction based on the measurement results of the plurality of measurement points 6a. Also, although there is a method to perform the alignment of the substrate 9 in the height direction without using, from the measurement results of the plurality of measurement points 6a, the measurement result of each measurement point which has been arranged in the step region, it is preferable to use as many measurement results as possible in order to accurately perform the alignment.

Hence, the exposure apparatus 10 according to this embodiment causes the measurement unit 6 to measure the height of the substrate 9 at each of the plurality of measurement points 6a in a state in which the shot region 91 is in a position (second position) shifted from the exposure position (that is, a position (to be referred to as a shifted position hereinafter) shifted from the irradiation region 4a). The shifted position is a position determined so that the number of measurement points 6a to be arranged in a plurality of partial regions 92 when the measurement unit 6 is to measure the height of the substrate 9 will be larger than the number of the measurement points 6a arranged in the plurality of the partial regions 92 when the shot region 91 is arranged at the exposure position. Such a shifted position can be determined based on information (to be referred to as arrangement information hereinafter) indicating the arrangement (layout) of the plurality of partial regions 92 on the substrate 9.

Figure 7:
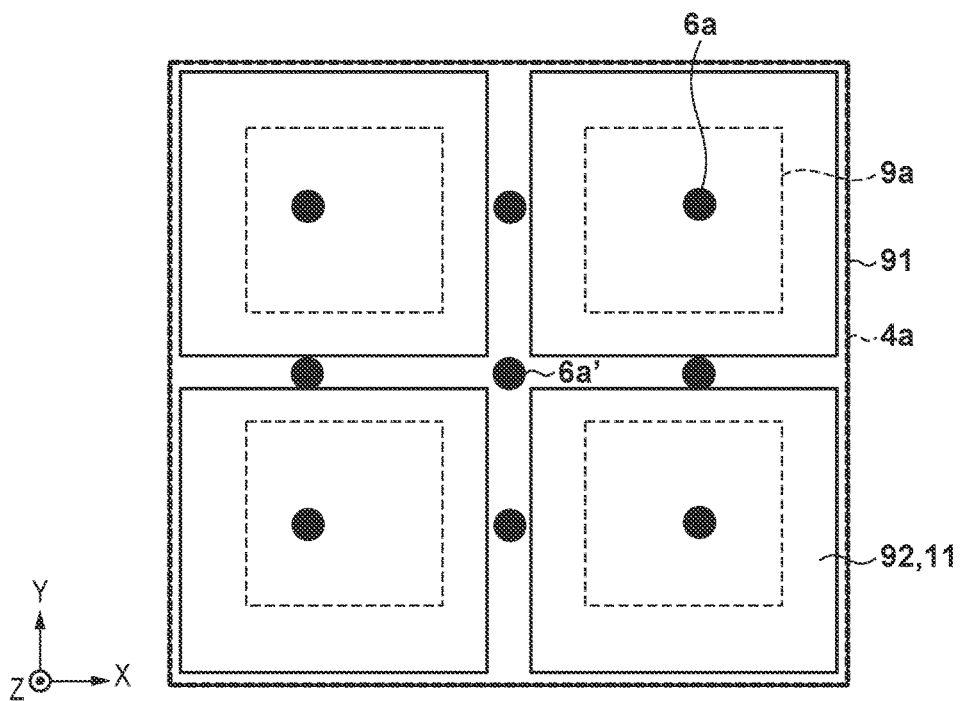
FIG. 7 is a view showing a state in which a shot region is arranged on an exposure position.

For example, assume a case in which the plurality of partial regions 92 on which the wiring layers 11 have been formed, respectively, are arranged spaced apart from each other on the shot region 91, and a pattern (electrode pads 12) is formed on each of the plurality of partial region 92 by exposing the shot region 91 at once. In this case, if the shot region 91 is aligned with the irradiation region 4a (if the shot region 91 is arranged at the exposure position) as shown in FIG. 7, some of the measurement points 6a of the plurality of measurement points 6a can be arranged in the cutting region 13 (step region) between the plurality of partial regions 92. Thus, in this state, it is difficult to accurately perform the alignment of the substrate 9 in the height direction based on the measurement results of the plurality of measurement points 6a.

Figure 8:
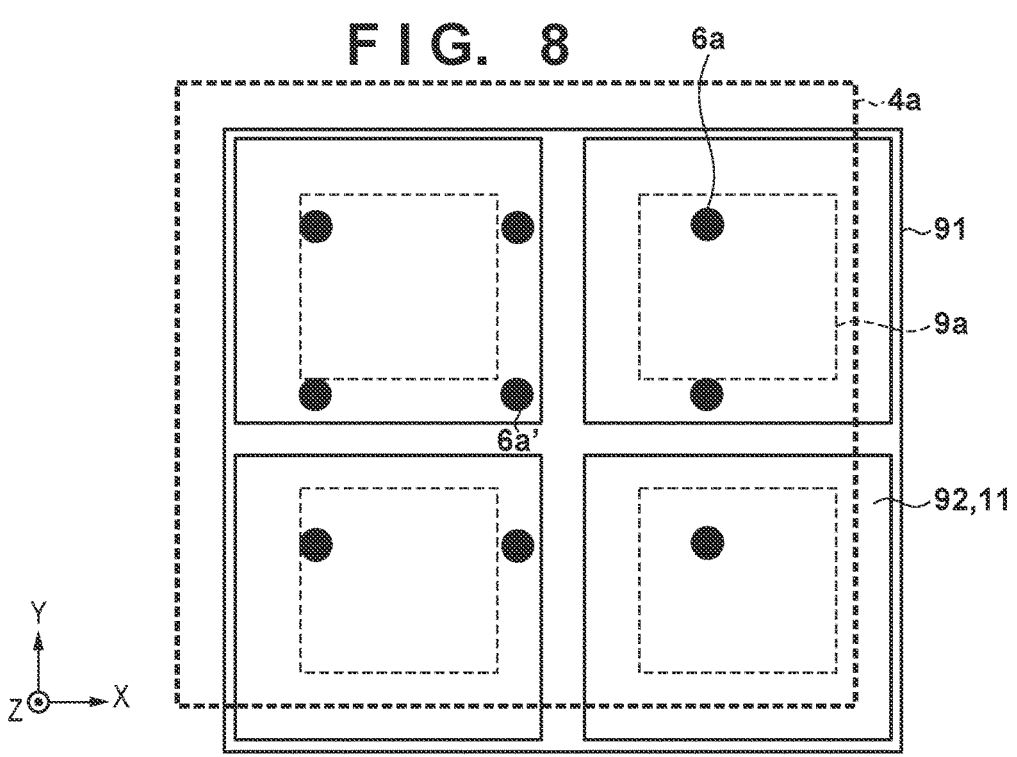
FIG. 8 is a view showing a state in which the shot region is arranged in a position shifted from the exposure position.

Hence, the exposure apparatus 10 according to this embodiment causes the shot region 91 to be arranged at the shifted position (see FIG. 8) so that the number of the measurement points 6a to be arranged in the plurality of partial regions 92 will be larger than that in the state shown in FIG. 7. Although all of the measurement points 6a are arranged in the plurality of partial regions 92 in the example shown in FIG. 8, all of the measurement points 6a need not be arranged in the plurality of partial regions 92. By arranging the shot region 91 at the shifted position in this manner, the alignment of the substrate 9 in the height direction can be accurately performed based on the measurement results of the plurality of measurement points 6a. Here, FIGS. 7 and 8 are views showing the shot region 91 which includes the plurality of partial regions 92 on which the wiring layers 11 have been formed, and the wiring lines 11a which are formed on each wiring layer 11 have been omitted for the sake of descriptive convenience. Each of the plurality of partial regions 92 is a region on which a pattern is to be formed and can include, for example, a region on which a semiconductor chip is arranged.

Figure 9:
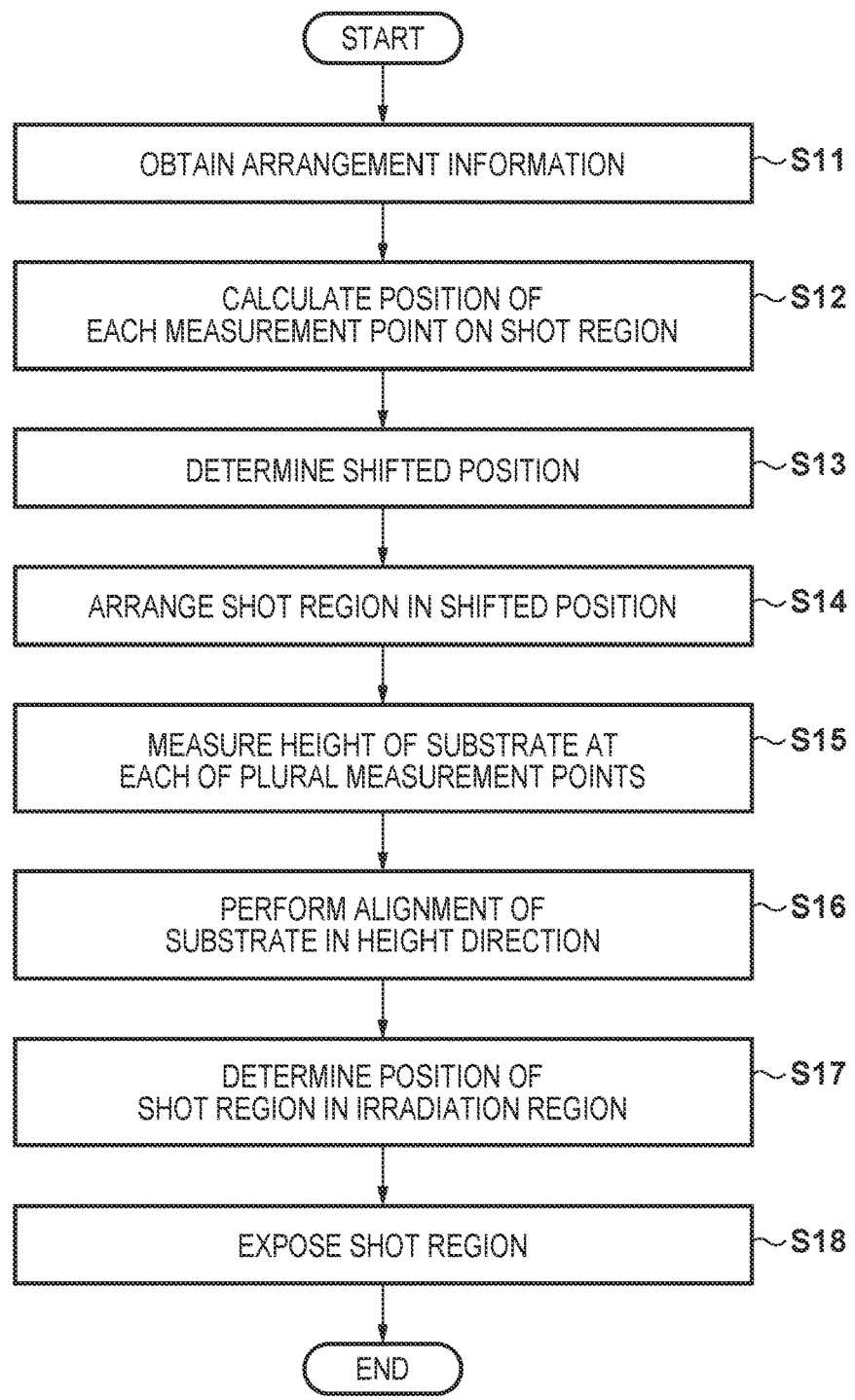
FIG. 9 is a flowchart showing a method of exposing the shot region of the substrate.

A method of exposing each shot region 91 on the substrate 9 in the exposure apparatus 10 according to this embodiment will be described below with reference to FIG. 9. FIG. 9 is a flowchart showing the method of exposing the shot region 91 on the substrate 9. Each process of the flowchart shown in FIG. 9 is controlled by the control unit 7. Here, assume that, as shown in FIGS. 7 and 8, on the shot region 91 which is to undergo exposure processing, the plurality of partial regions 92 on which the wiring layers 11 are formed, respectively, are arranged spaced apart from each other, and the cutting region 13 (step region) is formed between the plurality of partial regions 92. However, the arrangement is not limited to this. The plurality of partial regions 92 need not be arranged spaced apart from each other.

In step S11, the control unit 7 obtains the arrangement information that indicates the arrangement of the plurality of partial regions 92 on the substrate 9. The arrangement information can include, in addition to the information indicating the arrangement of the plurality of partial regions 92 on the substrate 9, information indicating the size of each of the plurality of partial regions 92. Also, the arrangement information can be obtained from, for example, the result of measuring (performing global-alignment measurement) the size and the arrangement of each partial region 92 by a measurement device internal or external to the exposure apparatus 10 or from the design data that indicates the arrangement and the size of each partial region 92. In addition, the arrangement information can be information input by the user via a communication I/F or a control panel provided on the exposure apparatus 10. Here, although the arrangement information according to this embodiment is information that indicates the arrangement of each partial region 92 on which a pattern is to be formed, it may also be, for example, information that indicates the arrangement of the plurality of semiconductor chips 9a, information that indicates each region to form the electrode pads 12 and the wiring layers 11, or information indicating the cutting region 13. However, these pieces of information can be regarded as representing information that indicates the arrangement of each partial region 92 on which a pattern is to be formed.

In step S12, the control unit 7 estimates (calculates), based on the arrangement information obtained in step S11, the positions on the substrate where the plurality of measurement points 6a are to be arranged, respectively, in a case in which the shot region 91 has been arranged at the exposure position. That is, the control unit 7 estimates, based on the arrangement information, the position of each measurement point 6a on the shot region 91 in a case in which the shot region 91 has been arranged at the exposure position. In the example shown in FIG. 7, of the nine measurement points 6a, the four measurement points 6a are arranged in the plurality of partial regions 92, respectively, and the remaining five measurement points are arranged in the cutting region 13.

In step S13, the control unit 7 determines the shifted position to arrange the shot region 91 so that the number of the measurement points 6a to be arranged in the plurality of partial regions 92 will be larger than that when the shot region 91 is arranged at the exposure position. The shifted position is, as described above, a position that has been shifted from the exposure position. For example, the control unit 7 determines the shifted position based on the arrangement information obtained in step S11 and the position information of each measurement point 6a on the shot region obtained in step S12. At this time, the control unit 7 can determine the shifted position so that as many measurement points 6a as possible (⅔ or more of the measurement points 6a of the plurality of measurement points 6a (preferably all of the measurement points 6a)) will be arranged in the plurality of partial regions 92. Here, the control unit 7 may determine, in step S13, the shifted position so that as many measurement points 6a as possible will be arranged on the semiconductor chips 9a of the respective partial regions 92. In this case, the control unit 7 can determine, if possible, the shifted position so that all of measurement point 6a will be arranged on the semiconductor chips 9a.

The control unit 7 can also determine the shifted position so that a reference measurement point of the plurality of measurement points 6a is arranged on any one of the plurality of partial regions 92. The reference measurement point is a measurement point that serves as a reference to the measurement results obtained from the plurality of measurement points 6a. In this embodiment, of the nine measurement points 6a, the reference measurement point is a measurement point 6a' arranged in the center. That is, the height of the substrate 9 measured at the reference measurement point is used as the reference of the height of the substrate 9 measured at each of the plurality of measurement points 6a. Additionally, it is preferable for the control unit 7 to satisfy at least one of the above-described conditions and determine the shifted position so that the positional shift of the shot region 91 with respect to the exposure position will be minimal. In this manner, by determining the shifted position, the time required to arrange the shot region 91 at the exposure position in order to expose the shot region 91 (that is, the time required to determine the position of the shot region 91 on the irradiation region 4a) can be shortened, and thus it is advantageous in the point of throughput.

In step S14, the control unit 7 causes the shot region 91 to be arranged on the shifted position determined in step S13. The arrangement of the shot region 91 to the shifted position can be performed by moving, for example, the substrate stage 5. Accordingly, as shown in FIG. 8, the number of measurement points 6a arranged in the plurality of partial regions 92 can be larger than that in the state in which the shot region 91 is arranged at the exposure position. In step S15, the control unit 7 causes the measurement unit 6 to measure the height of the substrate 9 at each of the plurality of measurement points 6a in a state in which the shot region 91 is arranged at the shifted position.

In step S16, the control unit 7 performs the alignment of the substrate 9 in the height direction (controls at least one of the height and the tilt of the substrate 9) based on the measurement results of the height of the substrate at the plurality of measurement points 6a in step S15. As a result, the surfaces of the plurality of partial regions 92 can be arranged on the imaging plane of the projection optical system 4. Here, even if the shot region 91 has been arranged in the shifted position in step S14, there may be measurement points 6a that are not arranged in the plurality of partial regions 92. In this case, based on the arrangement information, the control unit 7 selects, from the plurality of measurement points 6a set after the shot region 91 has been arranged at the shifted position, the measurement points 6a that are arranged in the plurality of partial regions 92. Then, the alignment of the substrate 9 in the height direction can be performed based on the measurement results of the selected measurement points 6a. That is, it is preferable to perform the alignment of the substrate 9 in the height direction without using the measurement results of the measurement points 6a which are not arranged in the plurality of partial regions 92 (for example, the measurement points 6a arranged in the cutting region 13).

In step S17, the control unit 7 determines the position of the shot region 91 in the irradiation region 4a (that is, arranges the shot region 91 at the exposure position), as shown in FIG. 7, by moving the substrate stage 5. In step S18, the control unit 7 exposes the shot region 91 arranged at the exposure position (controls the operation to expose the shot region 91). In this manner, the exposure processing is performed on the shot region 91 that includes the plurality of partial regions 92 on which patterns are to be formed.

As described above, the exposure apparatus 10 according to this embodiment causes the shot region 91 to be arranged in the shifted position so that the number of the measurement points 6a which are to be arranged in the plurality of partial regions 92 will be larger than that of a state in which the shot region 91 is arranged at the exposure position. The exposure apparatus 10 causes the measurement unit 6 to measure the height of the substrate 9 at each of the plurality of measurement points 6a in a state in which the shot region 91 has been arranged at the shifted position. Hence, the alignment of the substrate 9 in the height direction can be accurately performed based on the measurement results from the plurality of measurement points 6a.

This embodiment has described an example in which the plurality of partial regions 92 on which the wiring layers 11 have been formed, respectively, are arranged spaced apart from each other on the shot region 91 which is to undergo exposure processing, and a pattern (electrode pads 12) is formed on each of the plurality of partial regions 92. However, the present invention is not limited to this. For example, even in a case in which a reconstructed substrate on which no layer such as the wiring layer 11 is formed is used as the substrate 9, the exposure processing can be performed in the same manner as that in the above-described example. In this case, each of the plurality of partial regions 92 included in the shot region 91 becomes a region in which one semiconductor chip 9a is arranged. Then, when the measurement unit 6 is to measure the height of the substrate 9 at each of the plurality of measurement points 6a, the shot region 91 is arranged at the shifted position so that as many measurement points 6a will be arranged on the plurality of semiconductor chips 9a. In addition, in this embodiment, although a reconstructed substrate is used as the substrate 9, the present invention is not limited to this. The exposure processing can be performed (the present invention is applicable) in the same manner as the above-described example even if it is a substrate other than the reconstructed substrate. Particularly, the exposure processing can be performed effectively on a substrate which has a step region.

<Embodiment of Method of Manufacturing Article>

A method of manufacturing an article according to an embodiment of the present invention is suitable for manufacturing an article, for example, a microdevice such as a semiconductor device or an element having a microstructure. The method of manufacturing an article according to this embodiment includes a step of forming a latent image pattern on a photosensitive agent applied on a substrate by using the above-described exposure apparatus (a step of exposing the substrate), and a step of developing the substrate on which the latent image pattern is formed in the above step. This manufacturing method further includes other well-known steps (for example, oxidation, film formation, deposition, doping, flattening, etching, resist removal, dicing, bonding, and packaging). When compared to the conventional methods, the method of manufacturing an article according to this embodiment is advantageous in at least one of the performance, quality, productivity, and production cost of an article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-225372 filed on Nov. 18, 2016, which is hereby incorporated by reference herein in its entirety.

What is claimed is:

1. An exposure apparatus which exposes a first shot region of a substrate, comprising:
a measurement unit configured to measure a height of the substrate at each of a plurality of measurement points on the first shot region; and
a control unit configured to control at least one of the height and a tilt of the substrate based on measurement results obtained by the measurement unit, and control an operation to arrange the first shot region of the substrate in a first position and expose the first shot region while the first shot region is arranged in the first position,
wherein the first shot region includes a plurality of partial regions on which patterns are to be formed, and
the control unit causes the measurement unit to measure the height of the substrate by arranging the first shot region in a second position that is shifted from the first position, such that the number of measurement points arranged on the plurality of partial regions in the first shot region when the first shot region is arranged in the second position is larger than the number of measurement points arranged on the plurality of partial regions in the first shot region when the first shot region is arranged and exposed in the first position.

2. The apparatus according to claim 1, wherein the plurality of measurement points include a reference measurement point, the height of the substrate measured at the reference measurement point is used as a reference of the height of the substrate measured at each of the plurality of measurement points, and
the control unit causes the measurement unit to measure the height of the substrate by arranging the first shot region in the second position such that the reference measurement point is arranged on any one of the plurality of partial regions.

3. The apparatus according to claim 1, wherein the control unit causes the measurement unit to measure the height of the substrate by arranging the first shot region in the second position such that not less than ⅔ of the measurement points of the plurality of measurement points are arranged on the plurality of partial regions.

4. The apparatus according to claim 1, wherein the control unit determines an amount of shifting the first shot region from the first position to the second position, based on information indicating an arrangement of the plurality of partial regions in the substrate.

5. The apparatus according to claim 1, wherein the control unit controls, after arranging the first shot region in the second position and causing the measurement unit to measure the height of the substrate, the operation to arrange the first shot region in the first position and expose the first shot region.

6. The apparatus according to claim 1, wherein based on information indicating an arrangement of the plurality of partial regions in the substrate, the control unit selects, from the plurality of measurement points, measurement points arranged on the plurality of partial regions when the first shot region is arranged in the second position, and controls at least one of the height and the tilt of the substrate based on measurement results from the selected measurement points.

7. The apparatus according to claim 1, wherein the arrangement of the plurality of measurement points are fixed in the first shot region.

8. The apparatus according to claim 1, further comprising:
a stage configured to be movable while holding the substrate,
wherein the control unit arranges the first shot region in the second position by moving the stage.

9. The apparatus according to claim 1, wherein an amount of shifting the shot region from the first position to the second position is smaller than a size of the shot region.

10. A method of manufacturing an article by using an exposure apparatus which exposes a substrate including a first shot region including a plurality of partial regions on which patterns are to be formed, in a state where the first shot region is arranged in a exposure position, and measures a height of the substrate at each of a plurality of measurement points on the first shot region, the method comprising:
measuring the height of the substrate at each of the plurality of measurement points in a state where the first shot region is arranged in a measurement position that is shifted from the exposure position;
arranging the first shot region in the exposure position;
exposing the first shot region in a state where the first shot region is arranged in the exposure position while controlling at least one of the height and a tilt of the substrate based on the height of the substrate measured at each of the plurality of measurement points in the measuring; and
developing the exposed substrate,
wherein when measuring the height of the substrate in the state where the first shot region is arranged in the measurement position, the number of measurement points arranged on the plurality of partial regions in the first shot region is larger than the number of measurement points arranged on the plurality of partial regions in the first shot region when the first shot region is arranged and exposed in the exposure position.

11. The method according to claim 10, wherein the substrate includes a substrate on which a plurality of semiconductor chips are fixed by a molding material, and
each of the plurality of partial regions includes a region in which one semiconductor chip is arranged.

12. An exposure method of measuring a height of a substrate at each of a plurality of measurement points on the first shot region including a plurality of partial regions on which patterns are to be formed, and exposing the first shot region in a state where the first shot region is arranged in a exposure position, the method comprising:
measuring the height of the substrate at each of the plurality of measurement points in a state where the first shot region is arranged in a measurement position that is shifted from the exposure position;
arranging the first shot region in the exposure position; and
exposing the first shot region in a state where the first shot region is arranged in the exposure position while controlling at least one of the height and a tilt of the substrate based on the height of the substrate measured at each of the plurality of measurement points in the measuring,
wherein when measuring the height of the substrate in the state where the first shot region is arranged in the measurement position, the number of measurement points arranged on the plurality of partial regions in the first shot region is larger than the number of measurement points arranged on the plurality of partial regions in the first shot region when the first shot region is arranged and exposed in the exposure position.

* * * * *